United States Patent [19]

Nathanson et al.

[11] Patent Number: 4,769,883
[45] Date of Patent: Sep. 13, 1988

[54] METHOD FOR TUNING A MICROWAVE INTEGRATED CIRCUIT

[75] Inventors: Harvey C. Nathanson, Pittsburgh, Pa.; James G. Oakes, Worchester; Varley L. Wrick, Andover, both of Mass.; Michael C. Driver, Pittsburgh; Joseph C. Kotvas, Monroeville, both of Pa.

[73] Assignee: Westinghouse Electric Corp., Pittsburgh, Pa.

[21] Appl. No.: 472,529

[22] Filed: Mar. 7, 1983

[51] Int. Cl.$^4$ .......................... H01G 7/00; H01F 7/06; H05K 3/00; H01P 3/08; G01R 23/00
[52] U.S. Cl. ...................................... 29/25.42; 29/593; 29/829; 29/847; 29/602.1; 29/610.1; 333/246
[58] Field of Search ................ 29/593, 829, 840, 847, 29/853, 860, 25.42, 602 R, 610 R; 333/246

[56] References Cited

U.S. PATENT DOCUMENTS

| | | | |
|---|---|---|---|
| 3,113,896 | 12/1963 | Mann | 219/121 LJ |
| 3,402,448 | 9/1968 | Heath | 29/593 |
| 3,681,134 | 8/1972 | Nathanson et al. | 29/829 |
| 3,688,361 | 9/1972 | Bonini | 29/593 |
| 3,864,824 | 2/1975 | Watson et al. | 29/593 |
| 3,947,934 | 4/1976 | Olson | 29/593 |
| 4,288,530 | 9/1981 | Bedard et al. | 29/593 |

Primary Examiner—P. W. Echols
Attorney, Agent, or Firm—W. G. Sutcliff

[57] ABSTRACT

A method of tuning a microwave integrated circuit by trimming desired film-type circuit patterns included therein by a cold-pressure bonding technique is disclosed. More specifically, intercoupled circuit patterns are formed on a semi-insulating substrate with some circuit patterns having impedance characteristics of a desired nominal value. Each circuit pattern may comprise a plurality of conductive paths of malleable metal. Gaps are provided at appropriately chosen places in the conductive paths of predetermined circuit patterns. Selected ones of the gaps of the conductive paths are bridged to adjust the impedance characteristics of the associated predetermined circuit pattern by wiping with a probe the malleable metal of the conductive path at one end of the gap, across the gap to make contact with the malleable metal of the conductive path at the other end of the gap. The method further includes steps for in-situ testing of the integrated circuit by energizing the microwave integrated circuit to effect operation thereof; testing selected parameters of the energized microwave integrated circuit for determining the operational response thereof; and performing the step of bridging selected gaps of the energized microwave integrated circuit with a probe of insulating material to adjust the impedance characteristics thereof to render a desired measure response therefrom as determined by the testing step.

8 Claims, 7 Drawing Sheets

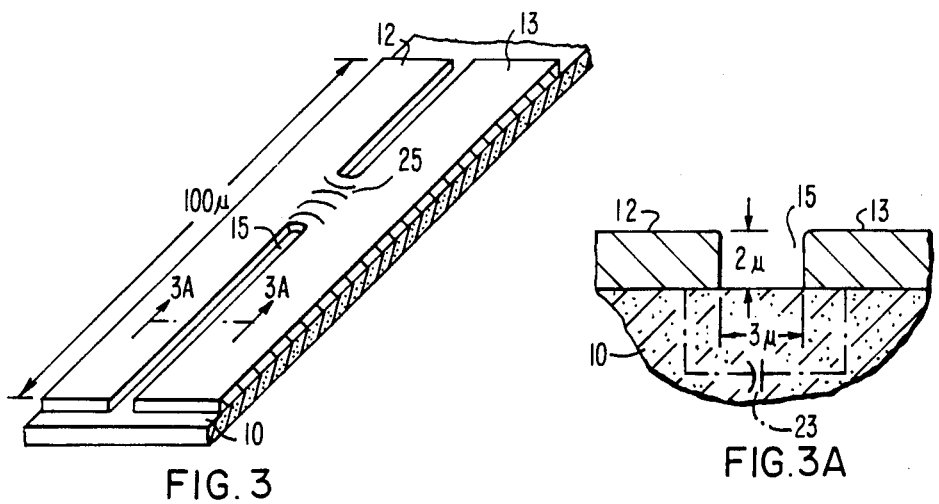
FIG. 3
FIG. 3A
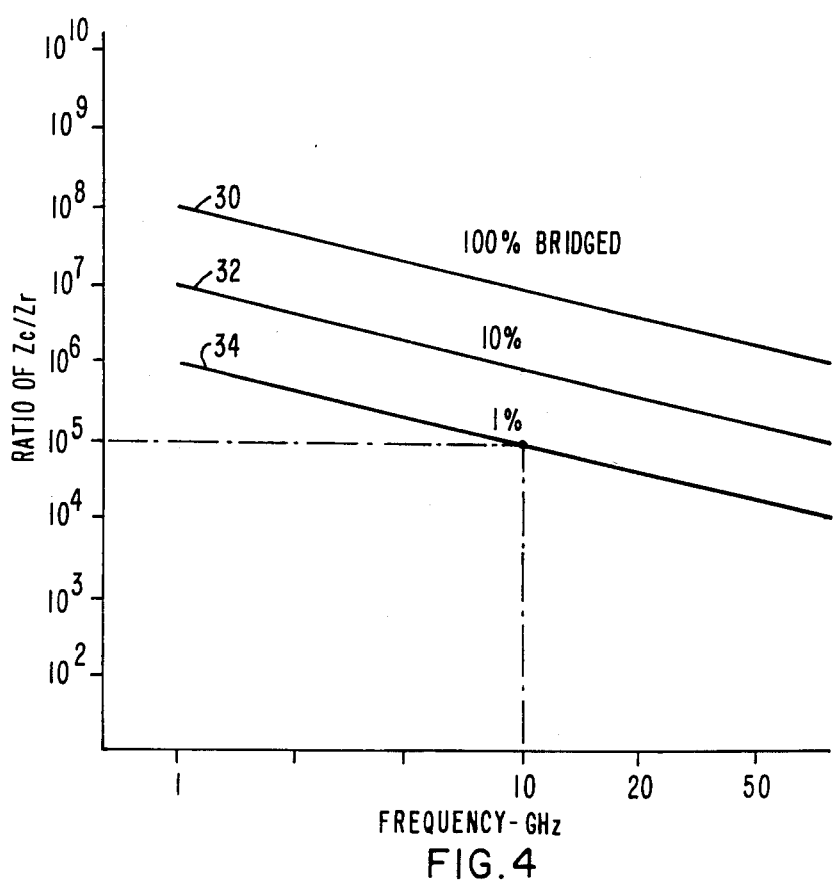
FIG. 4

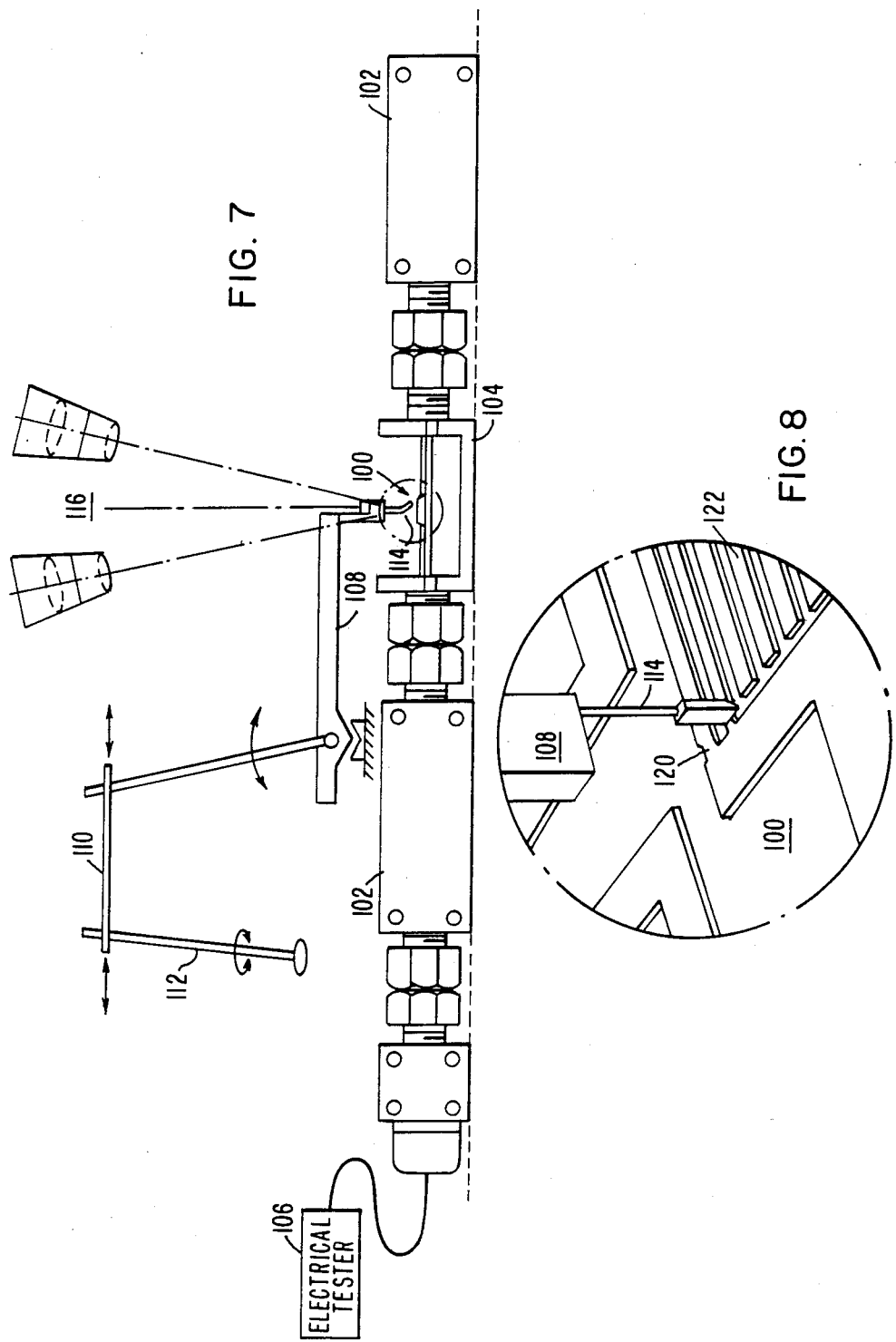

METHOD FOR TUNING A MICROWAVE INTEGRATED CIRCUIT

BACKGROUND OF THE INVENTION

The present invention relates to a method of tuning a microwave integrated circuit broadly, and more particularly to the trimming of predetermined film type circuit patterns thereof by a cold pressure bonding technique.

Recently, a great deal of interest has been generated by the research which scientists are doing on gallium arsenide integrated circuits, especially those of the power application variety. These small-lightweight high performance devices show great promise of being cost competitive. However, achieving this goal of low cost is predicated on the ability to trim the film-type circuit patterns included in these integrated circuits. For example, it has been indicated that if it is assumed that a circuit can be manufactured with one tuned circuit to 20% yield, then, assuming a Price-Like Statistical distribution (i.e. that which accounts for localized regions of a wafer having higher yield than other regions of the same wafer), it is found that for a two-mask process, the in-spec yield of 20 film-type impedance elements of the circuit would be less than 0.2%, which is fully unacceptable. It is well understood that analog tuning methods can increase the population of acceptable chips.

If the size of conventional microwave integrated circuits, like those implemented by microstrip technology, for example, are contrasted with recently developed gallium aresenide power integrated circuits a 50-100 to 1 miniaturization ratio is commonly realized. However, while on one hand this appears to be a benefit, on the other hand because of the small size many problems are manifested in the methods used for tuning the various circuits thereof. For example, the very small gallium arsenide integrated circuits do not respond well to the conventional laser tuning method because of the heating associated with this method which causes the gallium arsenide to lose stoichiometry and become conducting. That is, the heating of the laser beam has a tendency to drive off the arsenic from the gallium arsenide substrate leaving the integrated circuit with a different substructure and properties. An even more severe problem is that when heating with a laser beam, the metal conductive paths on the surface of the gallium arsenide substrate of the integrated circuit suffer metal splatterings which are deposited indiscriminately across the surface causing, at times, detrimental shorting of the circuit paths thereof.

Another well known method for tuning these gallium arsenide integrated circuits is the use of wire bonding techniques. While this method is entirely possible on the gallium arsenide integrated circuits, it is difficult to accomplish with precision and additionally requires that the substrate be heated to temperatures in excess of 200° C. or so before the large wire bonds will flow together with the metal contacts.

Another area of concern is in those cases in which the integrated circuit is coupled to a microwave test fixture for in-situ testing during the tuning procedure thereof. Under these conditions, the heat requirement becomes a real problem since the microwave measurements must be interrupted between every tuning adjustment. More specifically, the microwave test fixture has to be recalibrated after each tuning adjustment, making precise subtle tuning adjustments very difficult. These and other heating type problems associated with the tuning of the integrated circuits are proposedly alleviated by the inventive method disclosed herein in that the process for trimming the film type circuit patterns, like inductances and capacitances, for example, may be performed without the use of any heat treatment.

SUMMARY OF THE INVENTION

In accordance with the present invention, a method of tuning a microwave integrated circuit by trimming predetermined circuit patterns thereof is provided. Intercoupled circuit patterns, each comprising a plurality of conductive paths of malleable metal, are formed on a semi-insulating substrate. Some of the circuit patterns have impedance characteristics of a desired nominal value. Gaps are provided at appropriately chosen places in the conductive paths of predetermined circuit patterns to separate the conductive path at one end of each gap from the conductive path at the other end thereof. Selected ones of the gaps of the conductive paths of the predetermined circuit patterns are bridged to adjust the impedance characteristics thereof by wiping with a probe the malleable metal of the conductive path at one end of the gap across the gap to make contact with the malleable metal of the conductive path at the other end of the gap.

One of the circuit patterns is formed as a film-type variable inductor having a planar metallization pattern of a U-shaped outer edge conductor and plurality of metal strips within the boundary of the edge conductor mutually aligned substantially in parallel with the base of the U-shaped outer edge with a portion of the metal strips connected across the outer edges of the U-shaped conductor. The gaps are provided in the formed film-type variable inductor between the remaining unconnected portion of the metal strips and the U-shaped conductor edges. Selected ones of the unconnected metal strips are connected to the U-shaped conductor edges in accordance with the gap bridging step described hereabove to adjust the inductance characteristics of the variable inductor.

Another of the circuit patterns is formed as a film-type variable capacitor having a planar metallization pattern of two substantially parallel and separated end conductors and a plurality of metal strips disposed between the end conductors mutually aligned substantially in parallel transverse to the path of the end conductors with a portion of the metal strips connected interdigitatively to the end conductors. Gaps are provided in the formed film-type variable capacitor between the remaining unconnected portion of metal strips and the end conductors. Selected ones of the unconnected metal strips are connected to an end conductor in accordance with the gap bridging step described hereabove to adjust the capacitive characteristics of the variable capacitor.

Still another of the circuit patterns is formed as a film-type planar variable length bias line folded back upon itself. Gaps are provided at prespecified places along the double length of the bias line at the inside of the folded back portions thereof. A selected one of the gaps is connected in accordance with the bridging step described hereabove for tuning the bias line.

In one embodiment, the conductive paths of the circuit patterns are formed of a malleable metal consisting essentially of gold. In addition, the selected gaps may be bridged by wiping the malleable metal with an insulated probe consisting essentially of sapphire.

The method as described hereabove may include the further steps of energizing the microwave integrated circuit to effect operation thereof; testing selected parameters of the energized microwave integrated circuit for determining the operational response thereof; and performing the step of bridging selected gaps of the energized microwave integrated circuit with a probe of insulating material to adjust the impedance characteristics thereof to render a desired measured response therefrom as determined by the testing step.

BRIEF DESCRIPTION OF THE DRAWINGS

FIGS. 3 and 3A are illustrations for depicting the X-band R.F. impedance of an open gap versus a closed gap across the conductive paths.

FIG. 4 is a graphical representation for generalizing the results described in connection with the impedance comparison example of FIGS. 3 and 3A.

FIG. 7 is an illustration in cross-sectional view of an in-situ cold-welded method for achieving tuning of a monolithic type microwave integrated circuit during R.F. characterization.

FIG. 8 is a magnified illustration of the cold-weld pressure bonding method utilizing a sapphire probe for trimming the circuit patterns of the microwave integrated circuit chip as shown within the dashed line section of FIG. 7.

DESCRIPTION OF THE PREFERRED EMBODIMENT

Figure 1:
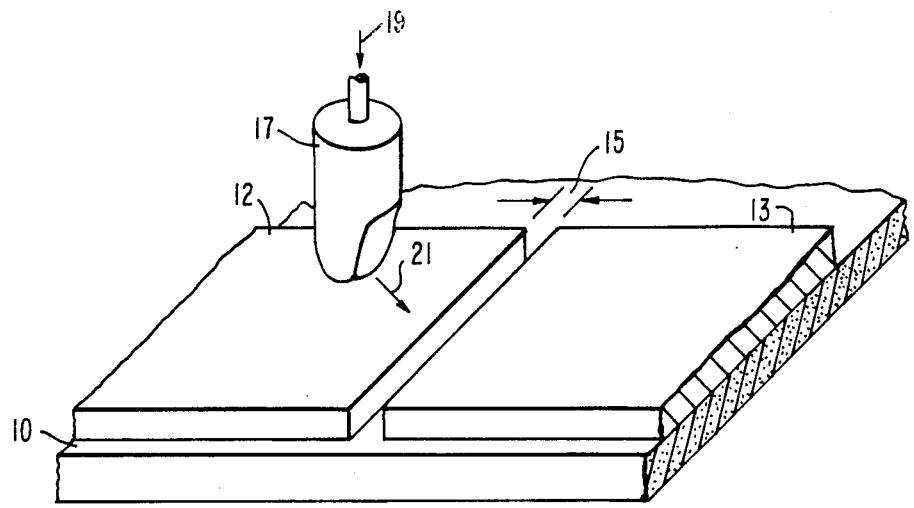
FIG. 1 is an isometric view of a portion of a semi-insulating type microwave integrated circuit suitable for illustrating a simple method relied on for the tuning applications of such integrated circuits.

Referring to FIG. 1, an isometric view of a portion of a semi-insulating type microwave integrated circuit is depicted for illustrating the simple method relied on for the tuning applications of such integrated circuits. More particularly, a semi-insulator substrate is shown at 10 and is preferably comprised of a gallium arsenide material. The conductive paths 12 and 13, preferably of a malleable metal, such as gold, for example, may be disposed over the surface of the substrate 10 and include a gap 15 which completely separates physically the two paths 12 and 13. An insulating probe or stylus 17 is shown depicted in FIG. 1 as being applied with some normal pressure denoted by the arrow 19 on the surface of the conductive path 12 in the vicinity of the gap 15. The insulating probe 17 is preferably made of a material such as sapphire, for example.

The portion of the integrated circuit shown in FIG. 1 is merely representative of a microwave integrated circuit as will become more apparent from the more detailed description found here below. Accordingly, it should be understood that many intercoupled circuit patterns may be formed on the semi-insulating substrate 10 with each circuit pattern comprising a plurality of conductive paths preferably of malleable metal and some of the circuit patterns having impedance characteristics of a desired nominal value. In accordance with the present invention, gaps such as the one shown at 15 in FIG. 1 may be provided at appropriately chosen places in the conductive paths of predetermined circuit patterns to separaate the conductive path at one end of each gap from the conductive path of the other end thereof. Thus, selected ones of these gaps of the conductive paths may be bridged according to some predetermined technique to adjust the characteristics of the predetermined circuit patterns.

The proposed method is shown by the cross-sectional views of the embodiment of FIG. 1 in FIGS. 2A-2D. This proposed method relies on the fact that a soft malleable metal can be "wiped" across a narrow gap which may have a width that is on the order of the thickness of the malleable metal conductive path itself. The metal gold is used for most gallium arsenide integrated circuit applications because of its compatible contact technology advantages. The thickness of the gold conductive paths is conventionally on the order of 1.5 microns. Gaps on the order of 1.5 to 5 microns wide are desirable, although slightly wider gaps of up to 10 microns wide may be "wiped shut" with care.

Figure 2A:
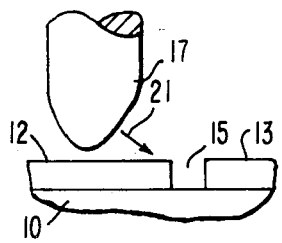
FIGS. 2A through 2D are a sequence of illustrations showing the cross-sectional views of the embodiment of FIG. 1 suitable for depicting the proposed method for bridging a gap between conductive paths.
Figure 2B:
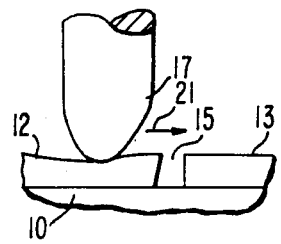
Figure 2C:
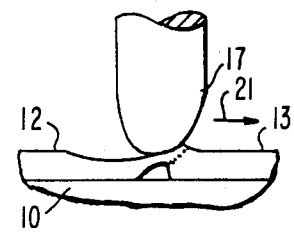
Figure 2D:
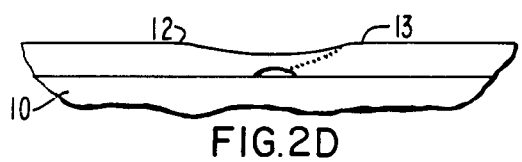

This "wiping" principle of the inventive method is shown in the sequence of FIGS. 2A-2D where an insulating probe 17 wipes shut the gap 15, which may be on the order of 1.5 microns, for example, causing a metal bridge between the conductive paths 12 and 13. Sapphire is considered a preferable material for the stylus 17 because it is very hard and generally used in wire bonding techniques because of the properties in which gold metal does not adhere to it. In the sequence of FIGS. 2A-2D, the stylus 17 is shown being positioned on the conductive path 12 in the vicinity of the gap 15 and moving in the direction 21 transverse to the gap 15. In FIG. 2B, the stylus 17 is shown disposed on the surface of the conductive path 12 with an adequate amount of cold bonding pressure applied thereto and still moving in the direction transverse to the gap 15 as denoted by the arrow 21. In FIG. 2C, the probe 17 has wiped the malleable metal of conductor path 12 across the gap 15 to make contact with the malleable metal of the conductor path 13. The stylus 17 is thereafter removed and the finished gap bridge, bonding the two conductive paths 12 and 13, is shown in FIG. 2D.

In some experimental tests which were conducted, the sapphire probe 17 was only about 10 microns in diameter and had a weight of about 50 grams. The pressures applied to the probe 17 to cause the gold metal to flow across the gap to make contact with the path on the other side reached values as high as 5000 kilograms per square centimeter, which is considered significantly higher than is encountered in conventional ball bonding techniques, where the ball bond diameter approaches 50 to 75 microns in some cases. The resulting bond as exemplified by the cross-sectional illustration of FIG. 2D was considered complete, integral and reliable. The efficiency of this bridging method described in connection with the diagrams of FIGS. 2A–2D, for radio frequency (hereinafter referred to as R.F.) bonding for trimming capacitance and/or circuit topology lies in the extremely large R.F. impedance change with such a cold pressure weld.

In the diagram illustrations of FIGS. 3 and 3A, the X-band R.F. impedance of an open gap versus a closed gap for a 0.003 inch wide conductive path with a 1% (0.75 micron wide) bridge is compared. FIG. 3A which is a cross section of the gap area of the illustration of FIG. 3 depicts the impedance properties of the gap when opened in which the predominant R.F. impedance is given by the inter-electrode capacitance 23 through the semi-insulating substrate 10 across the periphery of the gap 15. For purposes of illustration, the conductive paths 12 and 13 may be on the order of 2 microns thick and the gap on the order of 3 microns wide. Without the gap bridge, the capacitive impedance $Z_C$ across the conductive paths 12 and 13 may be computed as 2.7 kilohms at a frequency of approximately 10 gigahertz.

Now, when the gap 15 is wiped shut such as shown by the area at 25, which may be considered as a 1% smear in comparison to the width of the conductive paths 12 and 13, the impedance may be derived by a resistance formula of the one micron wide gold shunt across the conductive paths, neglecting impedance reflections effects of the smear 25. The resistive impedance $Z_R$ derived under these conditions is on the order of 0.03 ohms. Therefore, the comparison shows an impedance drop by a factor of 90,000 at 10 gigahertz with a 1% bridging of the conductive path width. This large drop in impedance makes the introduction of high or low impedance lines into the pre-existing microwave circuit possible with high precision, i.e. the impedance of the "gap" doesn't have to be taken into account in laying out most high impedance tuning circuit topology.

FIG. 4 graphically generalizes the results described in connection with the example of FIG. 3 and shows that through X-band frequencies, impedance ratios ($Z_C/Z_R$) of greater than $10^5$ are easily possible with the cold pressure bonding method for gap bridges encompassing 1% or greater than the original gap width (see FIG. 3). More specifically, the solid lines 30, 32 and 34 of the graph of FIG. 4 are representative of 100%, 10% and 1% gap bridging of the separation between the conductive paths. The ordinate of the graph represents the ratio of the capacitive to resistive impedances ($Z_C/Z_R$) and the abscissa is representative of the frequency range in gigahertz.

Figure 5A:
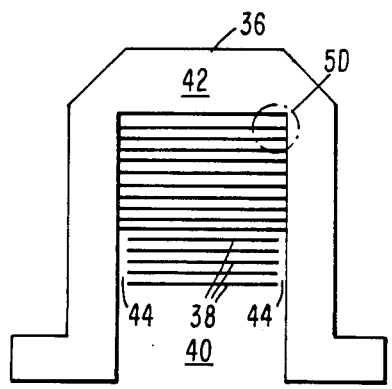
FIGS. 5A, 5B, 5C and 5D are illustrations of film-type circuit patterns which may be applied to variable impedances such as a variable inductor, a variable capacitor and a variable length bias line.
Figure 5B:
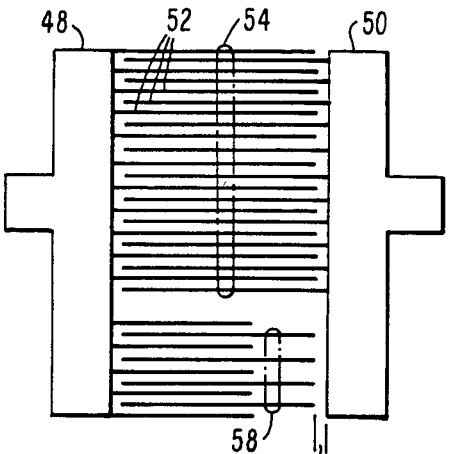
Figure 5C:
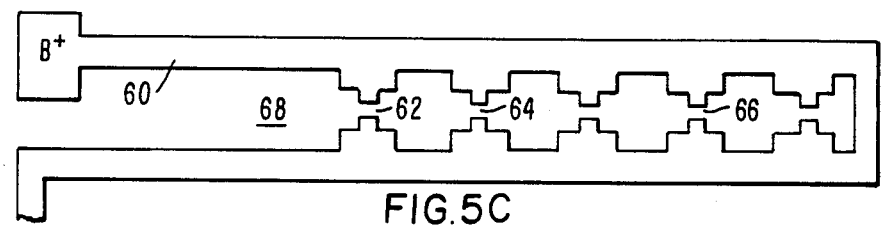
Figure 5D:
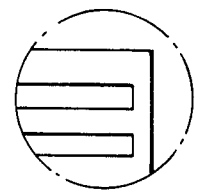

FIGS. 5A, 5B and 5C are illustrations of film-type circuit patterns which may be applied to variable impedances such as a variable inductor, variable capacitor, and variable length bias line, respectively. More specifically as shown in FIG. 5A, the circuit pattern formed as a film type variable inductor has a planar metallization pattern of a U-shaped outer edge conductor 36 and a plurality of metal strips 38 within the boundary 40 of the edge conductor 36. The metal strips 38 are mutually aligned substantially in parallel with the base 42 of the U-shaped outer edge 36 with a portion of the metal strips connected across the outer edges of the U-shaped conductor as shown in the enlarged pictorial illustration of FIG. 5D. Gaps 44, which may be on the order of 1.5 microns, for example, are provided in the formed film type variable inductor between the remaining unconnected portion of the metal strips and the U-shaped conductor edge 36. Selected ones of the unconnected metal strips may be connected to the edge conductor 36 in accordance with the gap bridging method as described in connection with FIGS. 2A–2D to adjust the inductance characteristics of the variable inductor as shown in FIG. 5A.

Referring to FIG. 5B, the circuit pattern formed as a film type variable capacitor has a planar metallization pattern of two substantially parallel and separated end conductors 48 and 50 and a plurality of metal strips 52 disposed between the end conductors 48 and 50 and mutually aligned substantially in parallel transverse to the path of the end conductors with a portion 54 of the metal strips connected interdigitatedly to the end conductors 48 and 50. Gaps 56 are provided in the formed film type variable capacitor between the remaining unconnected portion 58 of metal strips and the end conductors 48 and 50. Selected ones of the metal strips 58 may be connected to an end conductor 50 in accordance with the gap bridging method described in connection with FIGS. 2A–2D to adjust the capacitive characteristics of the formed variable capacitor.

Referring to FIG. 5C, a circuit pattern of a film type planar variable length bias line 60 folded back upon itself may be formed with gaps provided at prespecified places 62, 64, 66 . . . , along the double length of the bias line on the inside 68 of the folded back portions thereof. A selected one of the gaps may be connected in accordance with the gap bridging method described in connection with FIGS. 2A–2D for tuning the bias line.

Figure 6:
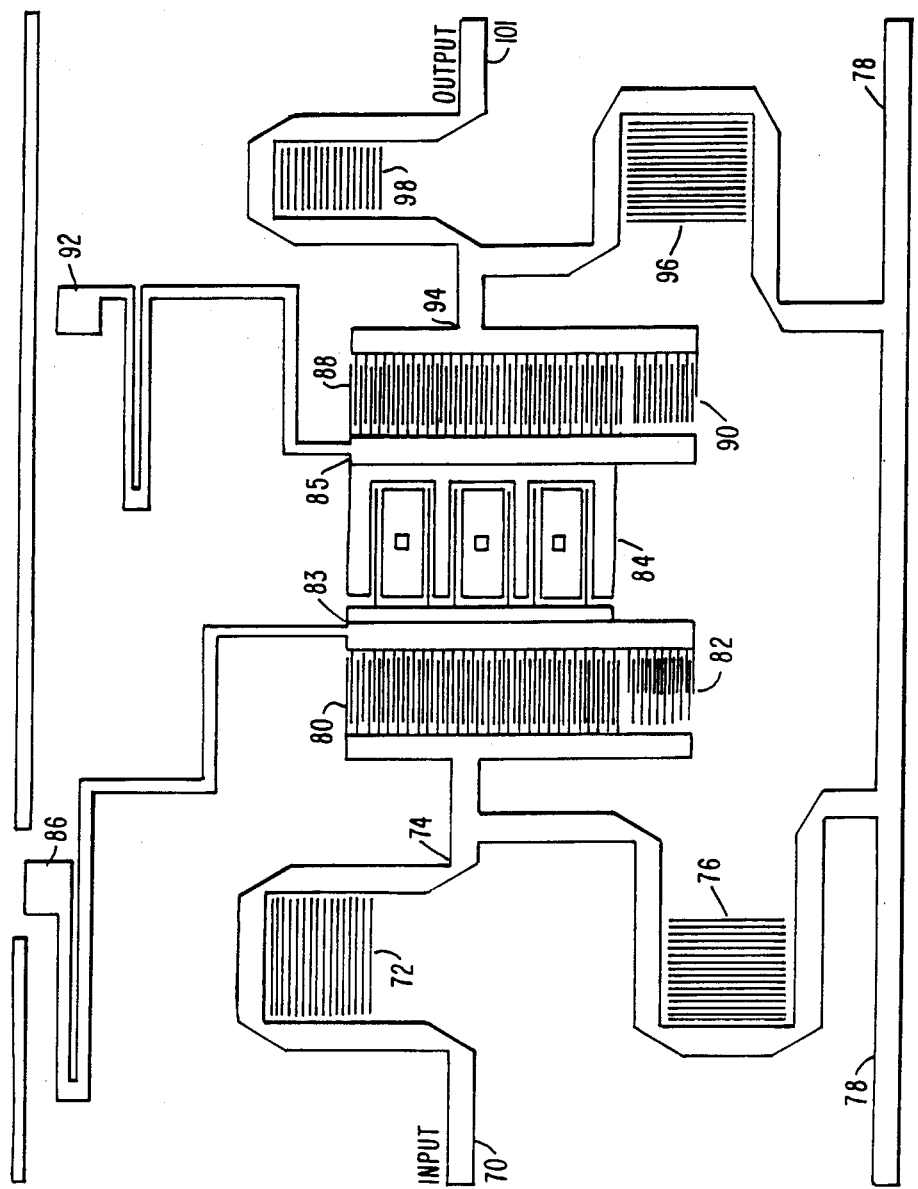
FIG. 6 depicts a schematic diagram of a monolithic gallium arsenide integrated circuit suitable for embodying the principles of the present invention and including provisions for trimming the inductances, capacitances and tunable bias lines of the elements contained therein.

A monolithic gallium arsenide intergrated circuit suitable for embodying the principles of the present invention and including provisions for trimming the inductances and capacitances and tunable bias lines of the elements contained therein is depicted in FIG. 6. More specifically, the circuit embodiment of FIG. 6 includes an input at 70 which is coupled to a tunable inductor 72. The output 74 thereof is coupled through another tunable inductor 76 to a first reference level 78 and is also coupled to a capacitor having a fixed capacitance portion 80 and a tunable capacitance portion 82. At least one transistor is included at 84 in the circuit, preferably by implanting a silicon doped region in the gallium arsenide substrate. The other end of the capacitor comprising portions 80 and 82 is coupled to the input of the transistor section 84. In addition, a tunable DC bias line 86 is also coupled to the capacitor/transistor junction 83. The output 85 of the transistor circuit 84 may be junctioned with another capacitance again having both a fixed 88 and tunable 90 section. Another variable bias line 92 is coupled to the second transistor/capacitor junction 85.

Moreover, the other end 94 of the capacitor comprising the sections 88 and 90 is coupled to two inductances, one being of a tunable variety shown at 96 and the other being of a fixed variety shown at 98. The tunable inductor 96 couples the junction 94 to the reference level 78 and the fixed inductor 98 couples the junction 94 to the output 101. Accordingly, the bias lines 86 and 92 may be coupled to other reference of voltage potentials dependent on the quiescent operating point of the microwave circuit. It is understood that the amplifier or other circuit designs would have to be such as to facilitate both a positive and a negative adjustment procedure in modifying the desired frequency response of the microwave circuit in accordance with the cold pressure bonding methods as described in connection with FIGS. 2A–2D.

A monolithic type microwave integrated circuit as exemplified by the schematic diagram of FIG. 6 may be tuned by an in-situ cold welded method for achieving permanent Hi-Q tuning during R.F. characterization. An illustration of such in-situ operation is shown by the cross-sectional sketch of FIG. 7. In addition, FIG. 8 shows a magnified illustration of the cold weld pressure bonding methods utilizing a sapphire probe for trimming the circuit patterns of the microwave integrated circuit chip taken from the dashed section of FIG. 7.

Referring to FIG. 7, a typical gallium arsenide power integrated circuit 100 is disposed in a conventional R.F. fixturing assembly 102 including a test assembly jig 104. A conventional electrical unit 106 provides the energization for the microwave integrated circuit shown at 100 within the jig 104 to effect operation thereof. The electrical device 106 additionally provides for the testing of selected parameters of the energized microwave integrated circuit for determining the operational response thereof. A manipulator arm 108 may be controlled by assembly manipulator linkages 110 utilizing a control mechanism like a joy stick 112, for example. The manipulator arm 108 includes an isolation probe 114 at the end thereof for performing the cold welded pressure bonding of the conducted paths of the integrated circuit shown at 100.

The integrated circuit chip itself may be made visible to an operator through a high-powered binocular microscope, for example, which is shown at 116. The microscope 116 may have a magnification along the order of 50× to 150×. The insulating probe 114 which is preferably made of sapphire provides for minimum R.F. circuit perturbations while under test. In this manner, complete integrated circuit tuning adjustment can take place while the integrated circuit is energized and operational thus obviating the disadvantages including: the need for circuit removal, heating of the bonding plenum, bonding, cooling, reinsertion of the circuit in the test jig, and recalibration of the R.F. apparatus and so on. As a result of this in-situ tuning method, room temperature capability and rapid relaxation into the desired tuning state of the integrated circuit is possible since the microwave test set 102 is capable of responding to a new impedance adjustment in a manner of a fraction of a second in the power domain.

Referring to FIGS. 7 and 8, in operation, the integrated circuits would be energized conventionally utilizing the electrical device 106 and associated R.F. fixturing 102/test jig 104. Under these conditions, the microwave integrated circuit shown at 100 is in an operational state. The electrical device 106 thus may test selected parameters of the energized microwave integrated circuit at 100 for determining the operational response thereof. Should the operatonal response be outside of the pre-specified region, the steps of bridging the selected gaps of the energized microwave integrated circuit 100 may be performed with the probe 114 to adjust the impedance characteristics of the integrated circuit under test to render a desired measured response therefrom as determined by the testing mechanism 106. The probe 114 as shown in FIG. 7 and in greater detail in FIG. 8 may be manipulated by the manipulator arm 108, linkages 110 and joy stick 112 to bond the desired conductive paths 120 on either side of the selected gaps as determined through viewing the integrated circuit 100 by the binocular microscope 116. FIG. 8 illustrates cold bonds being made at 120 by the sapphire probe 114. The circuit pattern 122 having its impedance characteristics varied is one of a film type tunable capacitor.

Figure 9:
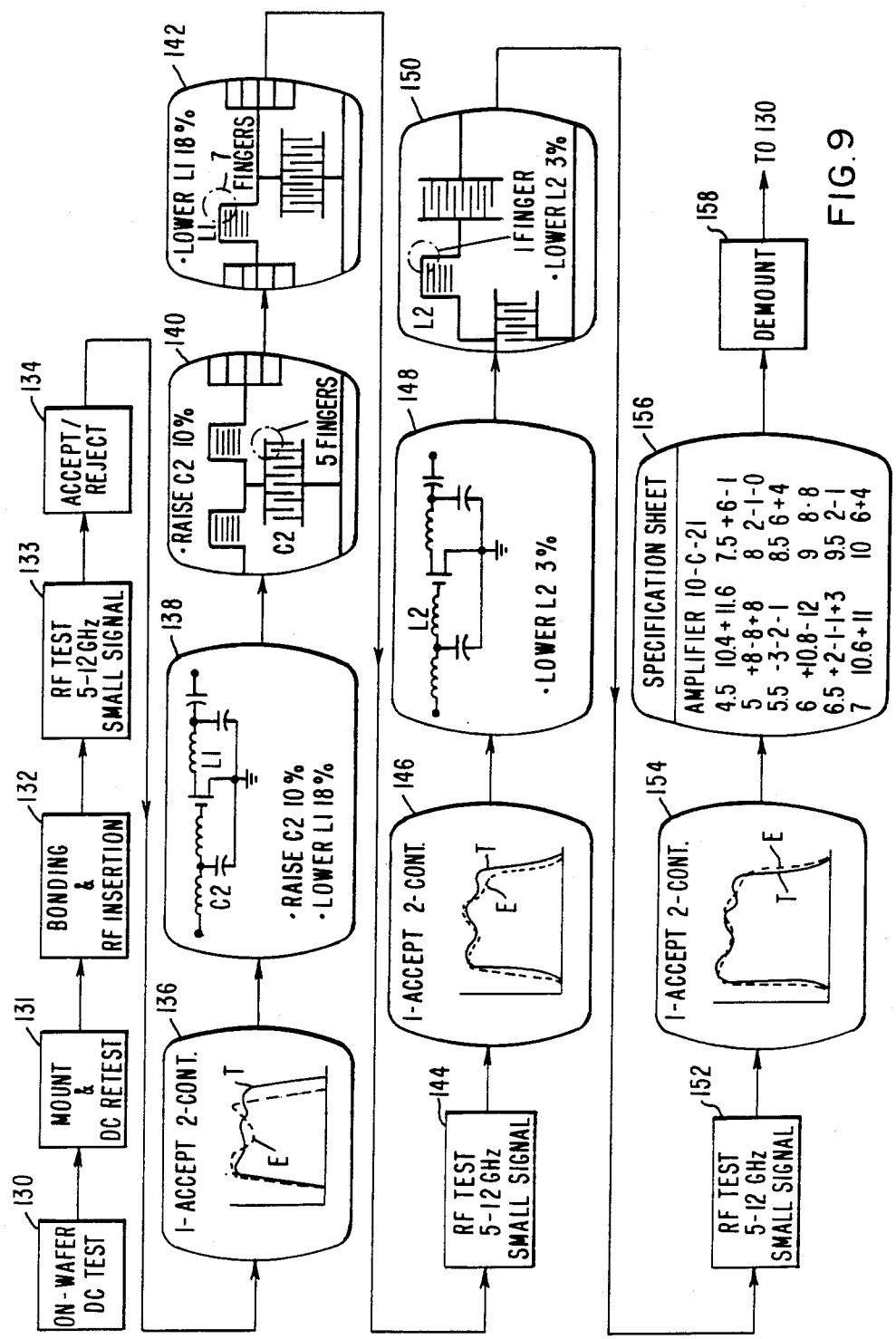
FIG. 9 is a block diagram sequence of steps of a semi-automatic circuit tuning method which may be used in conjunction with the in-situ test setup depicted in FIGS. 7 and 8.

A semi-automatic circuit tuning method which may be used in conjunction with the in-situ test setup illustrated in FIGS. 7 and 8 is exemplified in a block diagram sequential flow chart in FIG. 9. FIG. 9, which is self-explanatory, essentially provides an operator with a well-thought out analysis program functioning in conjunction with the aforementioned test set and should permit the operator to establish the next circuit element to tune and by how much to achieve the quickest relaxation into the desired transfer function. Ultimately, a computer may print out the final circuit performance, and indicate that the integrated circuit chip testing is complete and should be removed from the test jig.

More specifically, the first five blocks 130–134 of the block diagram sequence of FIG. 9 represent the initial semi-automatic testing sequence and are believed self-explanatory in accordance with the instructions of the blocks themselves. The next block 136 compares the test result denoted as T with the measure result denoted at E and determines which impedance or impedances of the microwave integrated circuit under test to adjust. For example, the next block 138 may instruct the operator to raise the tunable capacitor C2 by 10% and lower the tunable inductance L1 by 18% of the microwave integrated circuit depicted by the schematic drawing within the block 138. The next set of blocks 140 and 142 may suggest to the operator which conductive paths of the capacitance C2 and inductance L1 are to be bonded in accordance with the bonding method described hereinabove to achieve the prescribed percentage modifications. After bonding, the desired circuit paths specified in blocks 140 and 142, the integrated circuit may be again tested by the instructions of block 144 and the test results may be compared with those desired by the display of block 146. Here again, the solid line portion of the graph denoted as T is that desired and the dashed line portion of the graph E is that which is being actually measured.

To continue to bring the measured response to within that desired another instruction for tuning the impedances of the microwave integrated circuit may be provided in block 148 which suggests lowering the inductance L2 by 3%. The block 150 may display to the operator which conductive paths of the tunable inductance L2 should be bonded to achieve this suggested result. Next, after the bonding step, the microwave integrated circuit may again be tested by the instructions of block 152 and the response measured E may be compared with the desired response T as displayed by block 154. The response E now appears to be within the specifications of that desired T. When finished, the computer may print out the final circuit performance as shown by the block 156 and then indicate that the integrated circuit be removed by the instructions of block 158. Testing may be resumed on a new microwave integrated circuit for tuning thereof at point 130.

Another aspect of the inventive concept is that in addition to trimming the various aforementioned circuit patterns in-situ as described in connection with the figures hereabove, it is also possible to change the fundamental circuit configurations on-chip to perform different functions for the same elements of the integrated circuit. Thus, an integrated circuit could contain all the necessary transistors, inductances, capacitances, and bias lines to make a variety of functional end products. The operator or computer/operator combination may select various switch-type provided gaps in the conductive paths of the integrated circuit to connect together the circuit to accomplish the function in as simple a manner as possible to achieve the desired impedance function.

Figure 10:
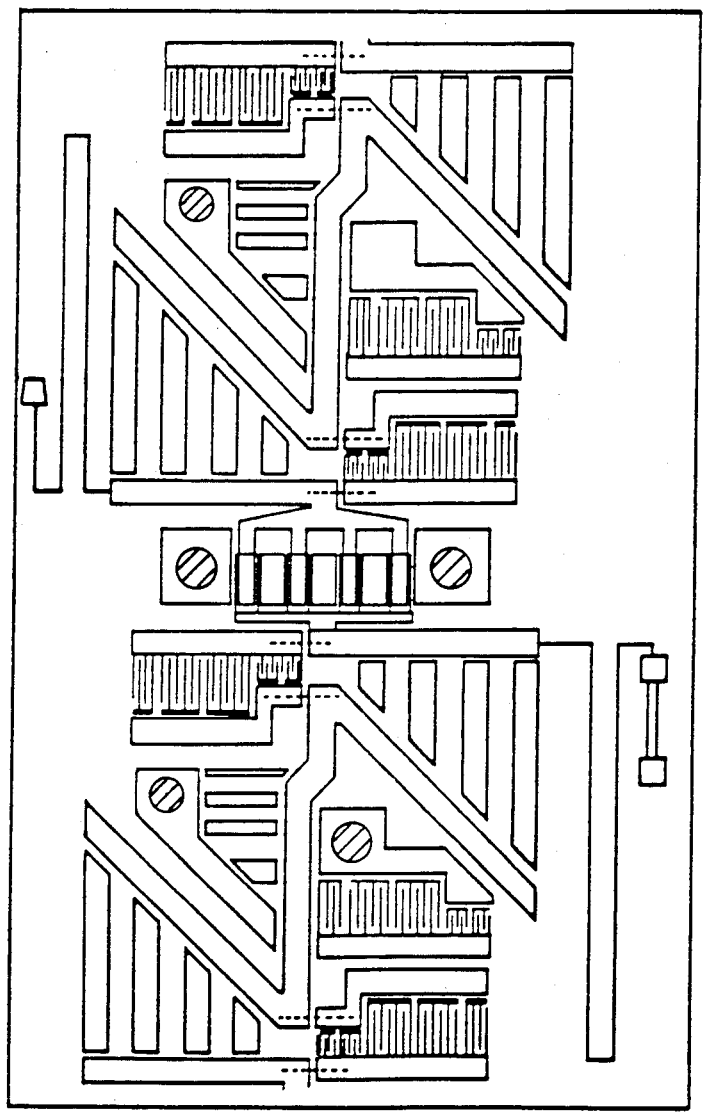
FIG. 10 is a plan view of an integrated circuit exemplifying a generalized circuit topology which includes not only individual film-type elements such as depicted in the above figures, but also gaps suitably disposed for varying the circuit functions thereof.

FIG. 10 exemplifies a generalized integrated circuit illustrating that not only circuit topology is desirable, but individual film type elements (L or C) are also variable to completely change the circuit function, e.g. unilateral versus feedback, amplifier two-stage versus three-stage, picket fence versus broad-band . . . in an economical manner. The universality of a programmable R.F. array is considered a very powerful one, one which promises cost-reduction by permitting large numbers of "universal chips" to be manufactured at high yield and then computer/operator connected in accordance with the cold weld pressure bonding described supra for optimum performance for the present and future needs.

In summary, an on-chip in-situ tuning and gap bonding method has been disclosed here above which would have strong utility especially in the microwave power integrated circuit areas of the future where low-cost and small size coupled with ultimate custom performance are important. The particular method utilizes gaps in the microwave conductive paths the length of which being on the order of the conductive path metal thickness. Under these conditions, it appears that a new family of in-situ tunable R.F. "universal circuits" may be produced at high volume and configured and tuned to precise specifications at low-cost.

We claim:

1. A method of tuning a microwave integrated circuit by trimming predetermined circuit patterns thereof, said method comprising the steps of:

forming intercoupled planar metallized integrated circuit patterns, each comprising a plurality of planar conductive paths of malleable metal, on the surface of a semi-insulating substrate and contiguous therewith, some circuit patterns having impedance characteristics of a desired nominal value;

providing planar gaps absent of metal at appropriately chosen places in the planar conductive paths of predetermined circuit patterns to separate the conductive path at one end of each gap from the conductive path at the other end thereof in substantially the same plane on said substrate surface; and bridging selected ones of said planar gaps of the conductive paths of said predetermined circuit patterns to adjust the impedance characteristics thereof by wiping with a probe the malleable metal of the conductive path at one end of the gap across the gap over said substrate surface where no metal exists and where metal would not flow otherwise to make contact with the malleable metal of the conductive path at the other end of the gap.

2. The method in accordance with claim 1 wherein at least one of said circuit patterns is formed as a film type variable inductor having a planar metallization pattern of a U-shaped outer edge conductor and plurality of metal strips within the boundary of said edge conductor mutually aligned substantially in parallel with the base of said U-shaped outer edge with a portion of said metal strips connected across the outer edges of said U-shaped conductor; wherein said planar gaps are provided in said formed film-type variable inductor between the remaining unconnected portion of said metal strips and said U-shaped conductor edges; and wherein selected ones of said unconnected metal strips are connected to the edge conductor in accordance with the gap bridging step of claim 1 to adjust the inductance characteristics of said variable inductor.

3. The method in accordance with claim 1 wherein at least one of said circuit patterns is formed as a film type variable capacitor having a planar metallization pattern of two substantially parallel and separated end conductors and a plurality of metal strips dispsed between said end conductors mutually aligned substantially in parallel transverse to the path of the said end conductors with a portion of said metal strips connected interdigitatedly to said end conductors; and wherein the planar gaps are provided in said formed film type variable capacitor between the remaining unconnected portion of metal strips and said end conductors; and wherein selected ones of said unconnected metal strips are connected to an end conductor in accordance with the gap bridging step of claim 1 to adjust the capacitive characteristics of said variable capacitor.

4. The method in accordance with claim 1 wherein at least one of said circuit patterns is formed as a film type planar variable length bias line folded back upon itself; wherein the planar gaps are provided at prespecified places along the double length of said bias line at the inside of the folded back portions thereof; and wherein a selected one of said gaps is connected in accordance with the bridging step of claim 1 for tuning said bias line.

5. The method in accordance with claim 1 wherein the conductive paths of the circuit patterns are formed of a malleable metal consisting essentially of gold.

6. The method in accordance with claim 1 wherein the selected planar gaps are bridged by wiping the malleable metal with an insulated probe consisting essentially of sapphire.

7. The method in accordance with claim 1 wherein the intercoupled circuit patterns are formed on a semi-insulating substrate of gallium-arsenide.

8. The method in accordance with claim 1 including the steps of:

energizing the microwave integrated circuit to effect R.F. operation thereof;

testing selected parameters of said energized microwave integrated circuit for determining the R.F. operational response thereof; and performing the step of bridging selected planar gaps of said energized microwave integrated circuit with a probe of insulating material to adjust in-situ the impedance characteristics thereof to render a desired measured R.F. response therefrom as determined by said testing step.

* * * * *